United States Patent [19]

Komuro et al.

[11] Patent Number: 4,970,532
[45] Date of Patent: Nov. 13, 1990

[54] LIQUID JET RECORDING HEAD

[75] Inventors: Hirokazu Komuro, Yokohama; Hiromichi Noguchi, Atsugi; Takahiro Mori, Yokohama, all of Japan

[73] Assignee: Canon Kabushiki Kaisha, Tokyo, Japan

[21] Appl. No.: 324,007

[22] Filed: Mar. 16, 1989

[30] Foreign Application Priority Data

Mar. 16, 1988 [JP] Japan .................................. 63-60320
Mar. 10, 1989 [JP] Japan .................................. 1-56089

[51] Int. Cl.$^5$ .............................................. B41J 2/05
[52] U.S. Cl. .............................. 346/140 R; 522/102; 522/121
[58] Field of Search ........................ 346/140; 525/305; 522/122, 121, 114, 102; 430/286, 281

[56] References Cited

U.S. PATENT DOCUMENTS

| | | | |
|---|---|---|---|
| 3,655,824 | 4/1972 | Kato | 525/305 X |
| 4,177,074 | 12/1979 | Proskow | 522/102 X |
| 4,417,251 | 11/1983 | Sugitani | 346/1.1 |
| 4,574,142 | 3/1986 | Charnock | 525/305 |
| 4,628,022 | 12/1986 | Ors | 522/100 X |
| 4,688,053 | 8/1987 | Noguchi | 346/140 |
| 4,839,668 | 6/1989 | Sato | 346/140 |

Primary Examiner—Joseph W. Hartary
Attorney, Agent, or Firm—Fitzpatrick, Cella, Harper & Scinto

[57] ABSTRACT

An ink jet recording head having an ink pathway in communication with a jetting exit formed on a substance on which an active element generating energy utilized for jetting out an ink is disposed, at least a portion of the ink pathway being constituted with a cured film of photosensitive resin, wherein the photosensitive resin composition includes (a) a specific high molecular compound, (b) a photopolymerizable compound having two or more acryloyl groups or methacryloyl groups in one molecule, and (c) a photopolymerization initiator. The ink jet recording head has various advantages, for example, (i) having satisfactory durability against a change in temperature during working conditions, (ii) causing no defoliation between the ink pathway walls and other constituent members even under continuous long-term use, (iii) developing no crack in the ink pathway walls even for continuous long-term use, and (iv) having satisfactory jetting durability.

4 Claims, 11 Drawing Sheets

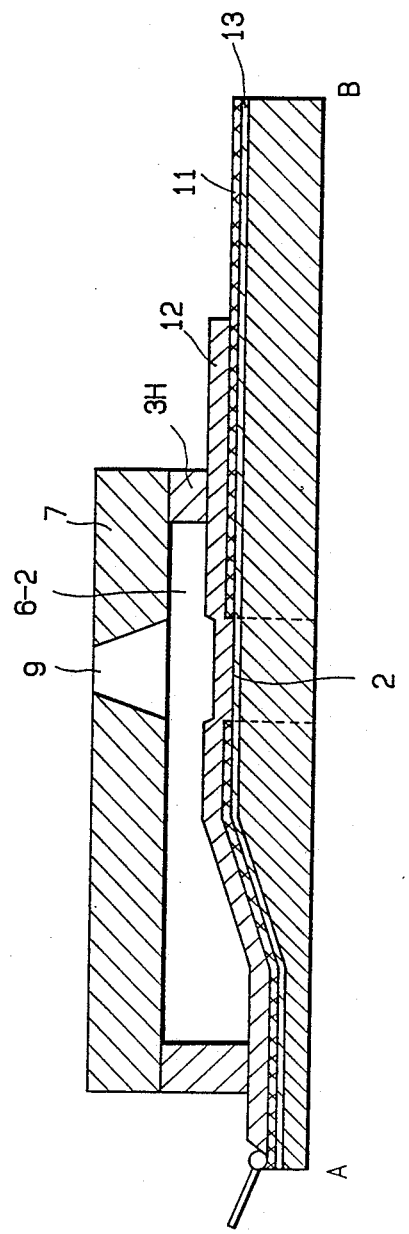

FIG. 10a
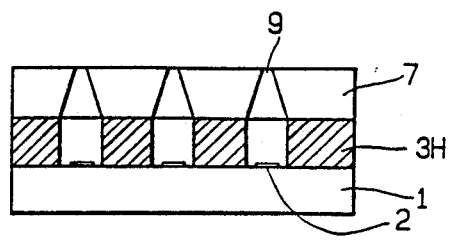
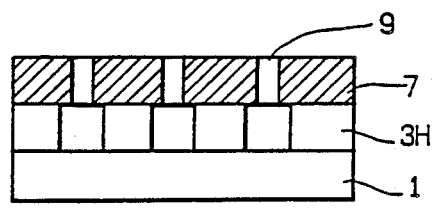
FIG. 10b

LIQUID JET RECORDING HEAD

FIELD OF THE INVENTION

The present invention relates to a liquid jet recording head to be used in a recording system which jets out liquid such as ink to produce its small droplets. More particularly, it relates to an ink jet recording head having ink pathways formed from a specific photosensitive resin for use in an ink jet recording system.

BACKGROUND OF THE INVENTION

Ink jet recording systems have recently attracted increasing interest since they can conduct high speed recording with negligible noise using so-called common paper with no particular requirement for fixing.

An ink jet recording head to be applied for the ink jet recording system is generally provided with minute ink discharging outlets (orifices), ink pathways and an ink discharging energy action portion disposed at a part of the ink pathways.

Hitherto, for the fabrication of such an ink jet recording head, there have been proposed various methods, for example, a method of forming minute grooves on glass or metal plate by cutting or etching and, subsequently, joining the grooved plate with another appropriate plate to form ink pathways.

However, for known ink jet recording heads manufactured by known methods, there are problems that the inner wall surface of the ink pathways formed by way of cutting is apt to be roughened excessively or distortion is likely to occur on the ink pathways due to the differences in the etching rate, and because of this, it is difficult to provide ink pathways of uniform flow channel resistance, thereby causing variations in the ink discharging characteristic. In addition, it also involves drawbacks that the plate tends to suffer from chipping or cracking upon cutting thereby reducing the production yield. Further, the etching fabrication requires a lot of production steps undesirably increasing production costs. Furthermore, there are other problems in common with the known methods: for example, when the engraved plate formed with ink pathway grooves and a substrate on which energy generating elements (hereinafter simply referred to as active elements) such as piezoelectric elements, heat generating elements, etc. for generating energy to be utilized for jetting out the ink are laminated to each other, the alignment between them is difficult to achieve when they are mass produced.

As an ink jet recording head having a constitution capable of overcoming these problems, there has been proposed an improved ink jet recording head, for example, in Japanese Patent Laid-Open No. Sho 58-43876 in which ink pathway walls comprising a cured film of a photosensitive resin composition are formed and, subsequently, a lid is disposed to the pathway walls. The ink jet recording head manufactured by utilizing the photosensitive resin composition is excellent in overcoming the problems of the ink jet recording head in the prior art, i.e., prior finishing accuracy for the ink pathways, complicated production steps and low production yields.

By its way, in the ink jet recording heads utilizing the photosensitive resin, solid film material mainly comprising an acrylic resin has mainly been used in view of its cost and its productivity characteristics. However, the ink jet recording head in which the ink pathway walls are formed by using the photosensitive resin composition mainly comprising the acrylic resin involves several drawbacks for example, as the recording time is remarkably increased, the ink discharge from the orifices, may sometimes be interrupted the accuracy of discharged ink droplets is reduced when they hit recording medium (such as paper as described above), etc.

In view of the above, there is a need for an ink jet recording head having improved hitting accuracy and the discharging durability capable of easily ensuring high reliability.

SUMMARY OF THE INVENTION

The present inventors have further made an earnest study for solving the foregoing problems in the ink jet recording head of the prior art in which ink pathway walls are formed by using a photosensitive resin composition mainly comprising an acrylic resin for satisfying the foregoing demand. That is, the present inventors have made various investigations and analyses of an ink jet recording head in order to recognize the causes for the foregoing problems. As a result, it has been found that there have been often caused cracks in the cured film of the photosensitive resin composition mainly comprising the acrylic resin constituting the ink pathways of the ink jet recording head, which has a remarkable effect on the discharge durability of the ink jet recording head and defoliation between the ink pathway walls and the substrate. Then, in the course of the study on such cause, it has been found that cracks sometimes develop due to the variation in temperature in the ink jet recording head, for example, due to operation of the heat generating element during continuous recording for a long time with remarkable temperature change. In addition, it has also been found that distortions remain in the head constituent material, such as a substrate or cured films of the photosensitive resin composition, due to the thermal hysteresis applied during manufacture of the recording head and that the distortions are gradually released due to the variations in temperature as described above during long recording operations, thereby causing defoliation.

This is demonstrated also by the difference in the heat expansion coefficient of the constituent materials for the ink jet recording head exemplified in Table 1. That is, as shown in Table 1, there is a great difference in the heat expansion coefficient between substrate constituent material such as glass, silicon and ceramics, and the photosensitive resin composition mainly comprising the acrylic resin in the prior art as the constituent material for the ink pathway. It has been well known that if heat of a changing temperature is continuously applied to a structural body comprising materials having large difference in the heat expansion coefficient, cracks are liable to occur.

By the way, the present inventors have conducted heat cycle test (heat-cooling cycle of −65° C. to 125° C.) on the ink jet recording head as described above using the photosensitive resin composition mainly comprising the acrylic resin in the prior art, and it has been confirmed that cracks were developed in the cured films of the photosensitive resin composition constituting the ink pathway walls. Further, the present inventors have also found that defoliation may occur sometimes between the substrate and the ink pathway walls when the ink jet recording head described above undergoes an ink immersion test under an elevated temperature.

Although a proposal has been made for specifying the design dimensions of the pathway walls in a predetermined range for preventing the development of cracks by Japanese Patent Laid-Open Application Sho 57-128867, the reading head is effective to prevent the development of cracks only for ink jet recording heads of a specific size but it is not effective for other various ink jet recording heads since there is no degree of freedom in the design. In addition, in view of the prevention of cracks, there has been proposed, for example, in U.S. Pat. No. 4,609,427, a method of incorporating silane coupler, metal chelate, metal adhesive, etc. between the substrate or the constituent material for the ink pathway walls, or incorporating them into the constituent materials for the ink pathway walls. However, with the elapse of a long time, the additives may sometime bring about solidification, corrosion, etc. of the composition, failing to obtain the desired prevention of defoliation.

The present invention has been accomplished under the foregoing background as a result of extensive studies by the present inventors for overcoming the foregoing problems and satisfying the demands of an ink jet recording head in which ink pathway walls are formed from a photosensitive resin composition mainly comprising an acrylic resin.

It is, accordingly, a principal object of the present invention is to overcome the foregoing problems in known ink jet recording heads and to provide an improved ink jet recording head of excellent discharging durability, capable of satisfying the foregoing requirements and capable of carrying out stable recording even during a long-time recording.

Another object of the present invention is to provide a highly reliable ink jet recording head which is free of peelings or cracks for a cured film of the photosensitive resin composition as the constituent element, irrespective of working conditions of the head and even upon continuous recording for a long period of time.

A further object of the present invention is to provide an improved ink jet recording head which is free of the reduction in the yield due to the peeling of the cured film of the photosensitive resin composition caused because of residual stresses, which occurs during known methods of manufacturing recording heads.

A still further object of the present invention is to provide an improved ink jet recording head which is free of the peeling, cracking, etc. of the constituent cured film element formed from the photosensitive resin composition due to thermal hysteresis on know recording heads.

BRIEF DESCRIPTION OF THE DRAWINGS

FIGS. 7(a) through 7(h), and FIGS. 10(a) and 10(b) are schematic views in transverse cross section along a plane perpendicular to the ink pathways of the ink jet recording head showing the used portions where the resin cured film is used in the present invention.

DETAILED DESCRIPTION OF THE INVENTION

Figure 1A:
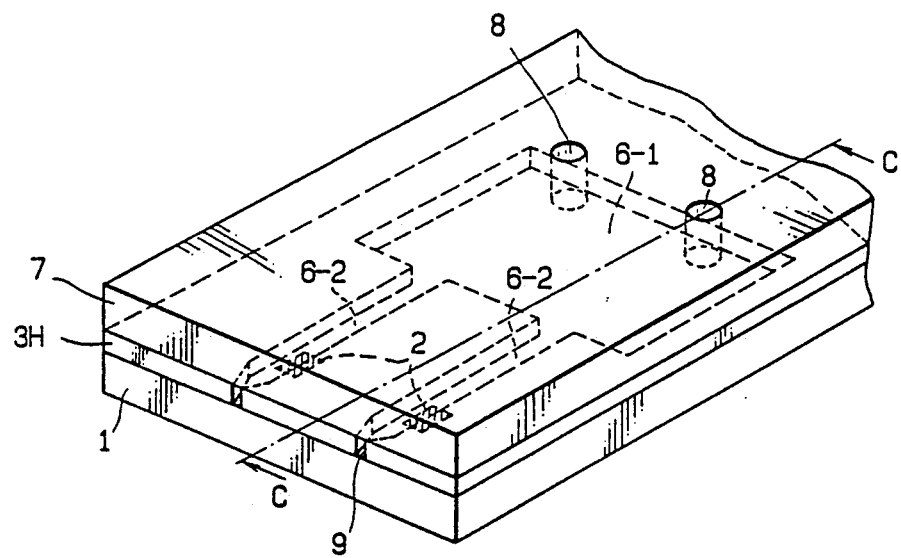
FIGS. 1(a) and 1(b), FIG. 2, FIGS. (a) and 3(b), FIG. 4, FIGS. (a) and 5(b)

The present invention attains the foregoing objects and provides an improved ink jet recording head in which ink pathways in communication with discharging exits are formed on a substrate on which ink discharging energy generating elements (or active elements in short) are disposed and at least part of the ink pathways is formed from a cured film of a specific photosensitive resin composition, wherein the photosensitive resin composition comprises a novel photosensitive rubber-modified acrylic resin composition described later.

The present invention is to be described more specifically.

For known ink jet recording heads, there is often found a difference in the heat expansion coefficient, for example, between the substrate and the ink pathway wall or between a ink pathway wall and the wall constituting the head due to the difference in the constituent materials. Therefore owing to the temperature change in the ink jet recording head under typical working conditions, due to, for example, a change in the ink temperature during recording, a difference is caused in the amount of dimensional change in the head constituent materials due to the difference in the heat expansion coefficients of the constituent materials, to cause distortions between the materials. The distortion is localized to a weak portion of the constituent materials of the head, that is, to the photosensitive resin composition layer constituting the ink pathway wall. And, it is considered that although most of such localized distortions are relieved in the photosensitive resin composition layer, in the case where the distortions are large cracks or peeling will be caused for the photosensitive resin composition layer.

By the way, the stress $\sigma$ applied to the photosensitive resin by such distortion can be expressed by the equation (1):

$$\sigma = k \times \epsilon \tag{1}$$

where k is a constant, ε is distortion and E is the modulus of elasticity of the photosensitive composition constituting the ink pathway walls.

As apparent from the equation (1), the distortion may be decreased by reducing the stress, that is, by reducing the modulus of elasticity E.

From the foregoing point of view, the present inventors have taken a notice on the modulus of elasticity (dyn/cm$^2$) of the cured film of the photosensitive resin composition and have made earnest study for developing the photosensitive resin composition having a lower modulus of elasticity and, as a result, have found a photosensitive rubber-modified acrylic resin described later capable of providing a desired low modulus of elasticity when the photosensitive resin composition is rendered into a cured layer. Then, it has been found that the foregoing object of the present invention can be attained by using a photosensitive resin composition mainly comprising a novel photosensitive rubber-modified acrylic resin found by the present inventors. For the cured film prepared by curing the photosensitive resin composition, it is considered that the rubbery constituent of the resin as the main constituent is present in the form of a island-like structure, which reduces the modulus of elasticity and, accordingly, causes the cured film to act as a stress absorber.

The photosensitive rubber-modified acrylic resin composition in the present invention is of the following constituents.

Specifically, this is a photopolymerizable resin composition comprising (A) a specific high molecular compound, (B) a photopolymerizable material having two or more acryloyl or methacryloyl groups in one molecule and (C) a photopolymerization initiator, in which said high molecular compound (A) comprises styrenic or acrylic monomer chained portion and another monomer chain part of which homopolymer being rubber.

Each of the constituents for the photopolymerizable resin composition in the present invention will be explained.

High Molecular Compound (A)

The high molecular weight compound used in the present invention has a number average molecular weight of 5000 to 30,000 and comprises a styrenic or acrylic monomer chain portion (hereinafter simply referred to as S&A chain) and another monomer chain portion of which the homopolymer is rubber (hereinafter simply referred to as G-chain). The S&A chain and G-chain may either be in block- or graft-form.

However, the styrenic or acrylic monomer should not be random copolymerized with the rubber monomer.

The content for the S&A chain and G-chain in the high molecular weight compound is such that the S&A chain is not less than 50%, preferably, from 60 to 80% by weight ratio. If S&A chain is within the above specified range, it can effectively function for the reduction of stresses.

A method of for producing the high molecular weight compound as described above will now be explained.

Method 1:

An acrylic oligomer having two or less glycidyl groups on the side chain in one molecule and a liquid rubber having terminal —COOH group are formed into an epoxy ester in an organic solvent.

For example, methylmethacrylate and glycidylmethacrylate are put in a solution polymerization at 97:3 molar ratio in toluene which is then esterified with COOH-terminated liquid rubber using benzyl dimethylasine as a catalyst under stirring at high speed at 80° C. for 5 hours.

Method 2:

An acrylic oligomer having two or less isocyanate groups on the side chain in one molecule and a liquid rubber having terminal —NH$_2$ or —OH group are subjected to coupling addition in an organic solvent.

Method 3:

An acrylic oligomer having two or less —OH group on side chain in one molecule and liquid maleic anhydride polybutadiene adduct are subjected to esterification in an organic solvent.

Method 4:

A styrenic oligomer having two or less acid anhydride group in one molecule and an epoxy polybutadiene are reacted in a solution.

Block copolymerization prepared by way of living anion polymerization between styrene or methylmethacrylate and isoprene Isoprene is subjected to living polymerization in dehydrated THF at −78° C. using sec-BuLi as a polymerization initiator and, subsequently, styrene or methylmethacrylate is polymerized thereto, to obtain a block copolymer of a type comprising: (S&A chain)—(G chain)—(S&A chain).

Graft copolymerization of a rubbery macromonomer having vinyl group on one terminal and acrylic monomer Polyisobutylene macromonomer having a vinyl group on one terminal and methylmethacrylate are subjected to radical copolymerization to obtain a graft copolymer of which the trunk chain is the "A chain" and branched chain is the "G chain".

By either of the aforementioned methods, high molecular weight compound used for the photopolymerization resin composition in the present invention can be obtained. The monomer used for the S&A chain can include, for example, styrene, 4-hydroxystyrene, methylmethacrylate, ethylmethacrylate, isobutylmethacrylate, t-butylmethacrylate, benzylmethacrylate, acrylonitrile, dimethylaminoethyl methacrylate, acrylic acid, methacrylic acid, 2-hydroxyethyl methacrylte, 3-chloro-2-hydroxypropyl methacrylate, glycidyl methacrylate, borneol methacrylate, borneol acrylate, dicyclopentenyl acrylate, dicyclopentenyl methacrylate and cyclohexyl methacrylate The monomer used for the G-chain can be represented by the polymer denomination thereof, such as, urethane rubber, liquid butyl rubber, liquid butadiene—styrene rubber, liquid acrylonitrile—butadiene rubber, liquid polyisoprene and liquid polybutylene, which contain at least one residue selected from the group consisting of —COOH, —OH, —NH$_2$,

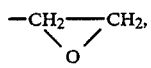

—CH=CH$_2$ and carboxylic anhydride group on the terminal or in the molecular chain thereof.

For the resultant high molecular compound it is considered that each of the monomers are present as the chain in any of the cases, to form a cyclodomin, that is, a domain comprising the G-chain and a domain comprising the S&A chain.

Photopolymerizable Material (B)

The photopolymerizable material containing two or more acryloyl or methacryloyl groups in one molecule used in the present invention is selected from the following various oligomers:

(1) Acrylic or methacrylic acid ester of a polyfunctionl epoxy resin having two or more epoxy groups in one molecule.

(2) Acrylic or methacrylic acid ester of a polyfunctional alcohol having two or more hydroxy groups in one molecule.

(3) Polyurethane acrylate obtained by the reaction of a polyester, polyether or liquid rubber containing terminal OH or COOH groups, a diisocyanate and an acrylate having hydroxy group.

(4) Acrylic ester of melacine, triarylcyanurate, triarylisocyanurate, triacrylisocyanurate. The material is properly selected and used depending on the application uses among them.

Although the use of monofunctional acrylate or monofunctional methacrylate is not essential in the photopolymerizable composition in the present invention, the use of such material in a small amount with the aim of improving reduced viscosity, wetting property, etc. causes no loss in the fundamental performance.

Photopolymerization Initiator (C)

As the photopolymerization initiator used in the present invention, the following materials used.
(1) Benzoin ethers: Benzoinisobutyl either, bezoinethyl ether, benzoinmethyl ether
(2) α-acryloxime-esters: 1-phenyl-1, 2-propane-dion-2(o-ethoxycarbonyl) oxime
(3) Benzyl ketals: 2,2-dimethoxy-2-phenylacetophenone benzyl hydroxycyclohexyl phenyl ketone
(4) Acetophenone: Diethoxacetophenone, 2-hydroxy-2-methyl-2-phenylpropane-1-one
(5) Aromatic Ketones: Benzophenone, chlorothioxanthone, 2-chlorothioxanthone, isopropylthioxanthone, 2-methylthioxanthone, 2-ethylanthraquinone, 2-t-butylanthraquionone.

Other Optional Ingredients (D)

(Sensitizer)

In the photopolymerizable resin composition according to the present invention, the following proton donor may be used together as a sensitizer for increasing the polymerization rate:
n-butylamine, triethylamine, diethylaminoethyl methacrylate, 4,4-bis(diethylamino)benzophenone,
4-dimethylaminoacetophenone, N-ethyldiethanolamine.

In the photopolymerizable resin composition according to the present invention, stabilizers capable of suppressing the dark reaction such as hydroquinone, paramethoxyphenyl, etc., colorant such as dye and pigment, silica, talc, alumina and clay for modifying the coatability, extender pigment such as sedimenting barium sulfate and flame retardant may be added as the optional ingredient.

Referring to the mixing ratio for each of the ingredients described above, the ratio between the high molecular weight compound and the photopolymerizable material is preferably from 100:50 to 100:300 and, most preferably, from 100:80 to 100:200 by weight ratio. Further, the ratio between (high molecular compound+photopolymerizable material) and the photopolymerization initiator is preferably from 100:2 to 100:10 and, most preferably, from 100:3 to 100:7. The photopolymerizable resin composition according to the present invention may be used either by a method of coating and drying them the composition in a liquid state to form a coating film of a predetermined thickness on a substrate or by a method of shaping the composition into a dry-film form and laminating the film on the substrate by means of a heat roll upon use to transfer and laminate the photopolymerizable resin composition. As the solvent used with the composition in the liquid state, the usual solvent such as toluene, xylene, methyl ethyl ketone, methyl isobutyl ketone, ethyl acetate, butyl acetate, cyclohexane, cellosolves etc. may be used alone or in admixture. In the case of conventional liquid rubber-type photopolymerizable resin, a highly polar solvent can not be used due to the low dissolving power, but there is no such restriction in the present invention.

Since the photopolymerizable resin composition in the present invention prepared as described above has a desirably low modulus of elasticity as described above, if the composition is cured into a cured film, distortion between the substrate and the ink pathway walls or between the ink pathway walls and the lid of the wall is absorbed. Therefore the ink jet recording head according to the present invention using the cured film will be free from the development of cracks in the ink jet recording head due to a change in temperature and will be free from the occurrence of defoliation between the substrate and the ink pathway walls or between the ink pathway walls and the lid due to the thermal hysteresis applied during production.

Although the ink jet recording head according to the present invention can be embodied in into various structures as desired, at least the cured product of the resin composition is used as a portion for the constitution thereof.

One embodiment of the ink jet recording head according to the present invention is to be explained specifically by referring to the drawings.

Figure 1B:
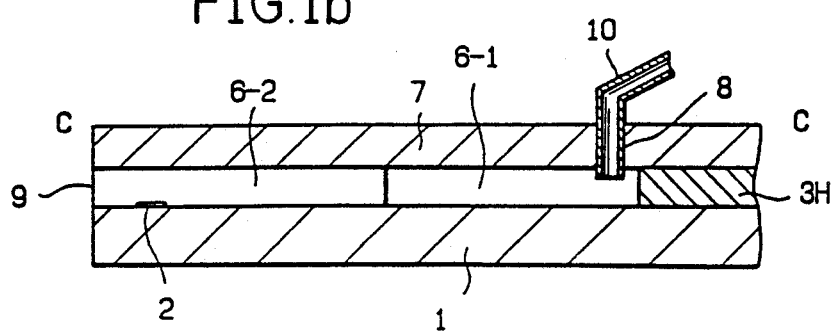

FIG. 1 shows one embodiment of an ink jet recording head according to the present invention, in which FIG. 1(a) is a perspective view for a main portion thereof and FIG. 1(b) is a cross sectional view taken along line C—C in FIG. 1(a).

The ink jet recording head basically comprises a substrate 1, ink pathway walls 3H disposed on the substrate and comprising a resin cured film patterned into a predetermined shape, and a lid 7 laminated on the ink pathway wall, which constitute orifices 9 for discharging the recording ink, ink pathways 6-2 each having a portion in which energy for jetting the recording ink is acted on applied to the recording ink and an ink chamber 6-1 for storing the recording ink to be supplied to the ink pathway. Further, throughholes 8 disposed to the lid are connected with supply tubes 10 for supplying the recording ink from the outside of the recording head to the ink chamber 6-1. Respective active elements 2 such as heat generating elements or piezoelectric elements are disposed corresponding to the ink pathways 6-2 respectively and disposed at such positions that the energy generated from the elements 2, when driven, can act to the corresponding portion of the recording ink in the ink pathways 6-2. The supply tube 10 is not shown in FIG. 1(a).

Upon recording, energy utilized for discharging the recording ink from the orifice 9 is generated by applying a discharge signal as required by way of wiring, not illustrated, (connected to the element 2) to the active element 2.

The substrate 1 constituting the recording head according to the present invention is made of glass, ceramics, plastics or metals, on which the active elements 2 are disposed in the desired number and at predetermined positions. Although there are two elements in the embodiment shown in FIG. 1, the number and the positioning of the heat generating elements are properly determined depending on the predetermined constitution of the recording head.

The lid 7 comprises a flat plate made of glass, ceramics, plastics or metals and bonded on the ink path walls 3H by means a fusion or adhesion method of using adhesives, and throughholes 8 are disposed at predetermined positions for connection with the supply tubes 10.

In the recording head, the cured resin film patterned to a predetermined shape for constituting the walls 3H of the ink pathways 6-2 and the ink chamber 6-1 are obtained by patterning the layer disposed on the substrate 1 or the lid 7 and constituted with the photosensitive rubber-modified acrylic resin composition containing the constituent ingredients A-D as described above by means of a photolithographic step.

Although an explanation has been provided of an embodiment using the cured film of the resin composition for the constitution of the ink pathway walls 3H, the cured film (cured product) of the resin composition can also preferably be used in other portions in the recording head.

For instance, as shown in FIGS. 7(a)-(h) representing the partially cross section portion of the recording head perpendicular to the ink pathway, the cured film can be utilized, for example, as:

1. lid 7(a),
2. ink pathway wall 3H and lid 7(b) (in this case, the ink pathway wall 3H and the lid 7 may be formed integrally or they may be joined after formed separately),
3. adhesive layers 14 between the ink pathway wall 3H and the lid 7 formed from various resins, etc. (c), (e) and (g),
4. adhesive layer 14 between ink pathway wall 3H and ink pathway wall 3H and lid 7, and
5. adhesive layer 14 (dual layer) between ink pathway wall 3H and ink pathway wall 3H and lid 7(h).

Figure 7A:
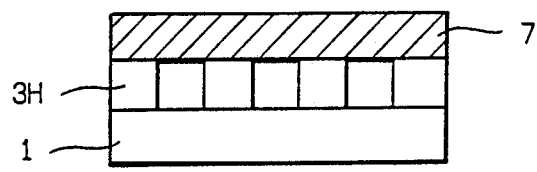
Figure 7B:
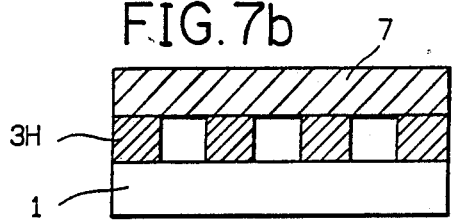
Figure 7C:
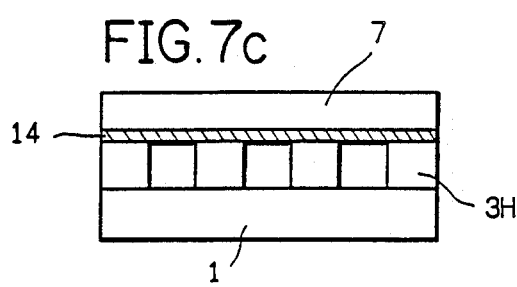
Figure 7D:
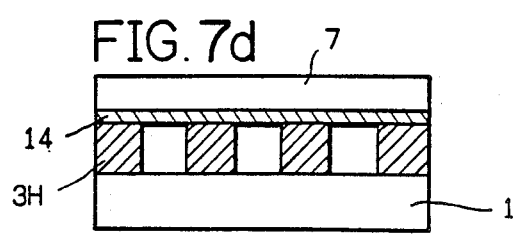
Figure 7E:
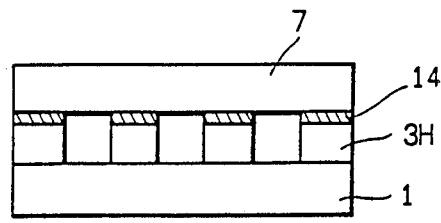
Figure 7F:
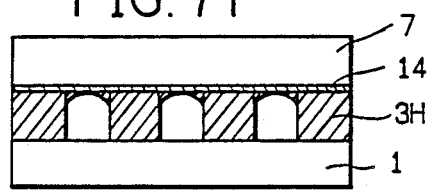
Figure 7G:
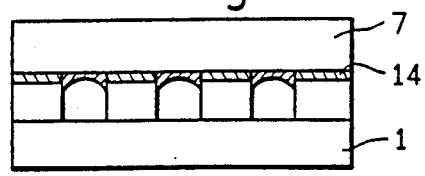
Figure 7H:
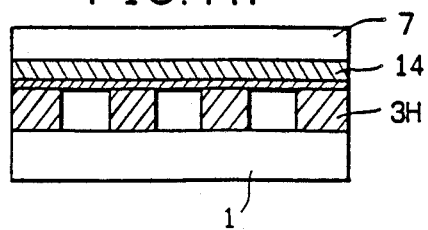

Among the constitutions described above, a dry film type resin can preferably be utilized for the constitution of FIGS. 7(a)-(e), (h) and for forming the ink pathway walls 3H in FIG. 7(f), while the resin cured from the liquid state is preferably used as the adhesive layer 14 in FIGS. 7(f) and (g).

Figure 8B:
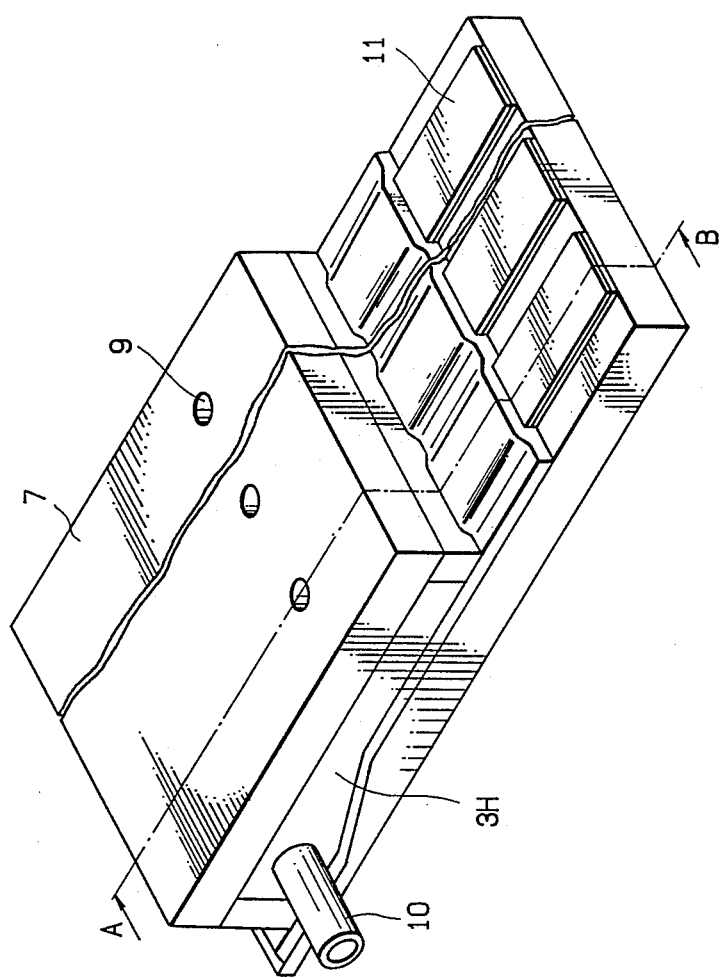
FIGS. 8(a) and (b), as well as FIG. 9 are schematic views showing other constitutions of the ink jet recording head of the present invention.
Figure 9:
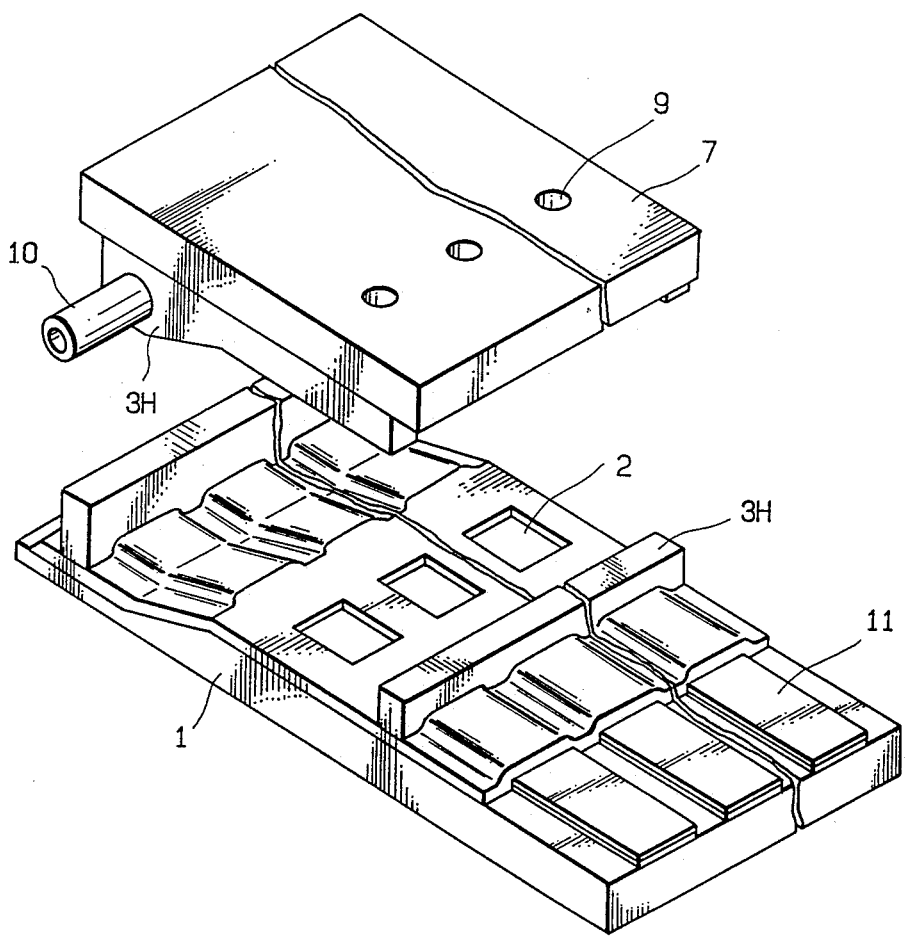

Further, the recording head according to the present invention may have a structure for discharging the droplets in a direction perpendicular to the ink pathway (6-2) as shown in FIGS. 8(a) and (b), and FIG. 9, in which the cured layer of the resin composition can preferably be used in similar portions as those shown in FIG. 7 above such that the portions, for example, shown in FIGS. 10(a) and (b).

The photosensitive rubber-modified acrylic resin composition containing the constituent ingredients A-D described above used for the constitution of the recording head according to the present invention is as described below. That is, the resin composition has satisfactory adhesion with various members such as a substrate made of glass, plastic and ceramics, particularly when formed into a cured film, is excellent in durability of the recording liquid such as ink and mechanical strength, and also has is excellent as the constituent member for the ink jet recording head capable of forming an accurate pattern at high resolving power by patterning with the actinic energy rays.

Further, the resin composition can also be used in the form of a dry film, in which it can also provide foregoing the excellent properties.

As the solvent used when the photosensitive rubber-modified acrylic resin composition is used as described above in the form of a solution or in the case of using the resin composition on a plastic film as a film substrate for manufacturing the ink jet recording head according to the present invention, there can be mentioned hydrophilic solvents such as alcohols, glycol ethers, glycol esters, etc. It is of course possible to use these hydrophilic solvents as the main ingredient, which are properly admixed, as required, with ketones such as methyl ethyl ketone and methyl isobutyl ketone; esters such as ethyl acetate and isobutyl acetate; aromatic hydrocarbon such as toluene and xylene and halogen substituted products thereof, chlorine-containing aliphatic solvents such as methylene chloride, 1,1,1-trichloroethane, etc. These solvents may also be used as a liquid developer for the resin composition according to the present invention.

Upon manufacturing the ink jet recording head according to the present invention, the resin composition can form a cured layer on a substrate, etc. by an ordinary method, for instance, as described below.

(1) In the case of forming layer comprising a cured coating film on the substrate, etc.:

The liquid photosensitive rubber-modified acrylic resin composition is applied on the substrate, etc. and, for forming the liquid coating film subsequently, evaporated to dry. Then, the resultant dried coating film is cured by irradiating with actinic energy rays, for example, UV-rays to form a layer comprising the cured coating film.

(2) In the case of forming a layer comprising the cured coating film in a predetermined pattern on the substrate, etc.:

Liquid photosensitive rubber-modified acrylic resin composition in the liquid state is applied on the substrate, etc. for forming the liquid coating film and, subsequently, evaporated to dry. Then, a layer comprising a cured coating film of a desired pattern is formed on the substrate, etc. by causing laser beams to scan in a predetermined pattern an the layer comprising the dried coating film, and removing the unexposed portion with an appropriate solvent such as 1,1,1-trichloroethane.

(3) In the case of forming a layer of a cured coating film in a predetermined pattern on a substrate. etc:

The photosensitive rubber-modified acrylic resin composition in a liquid state is applied on the substrate, etc. and, for forming the liquid coating film subsequently, evaporated to dry. A photomask having a pattern of a predetermined shape not allowing the active energy rays to permeate therethrough is overlaid on the resultant layer comprising the dried coating film and the film was exposed with actinic energy rays from above the photomask. Then, the unexposed portion is eliminated by means of an appropriate solvent such as 1,1,1-trichloroethane, thereby forming a layer comprising a cured coating film of a desired pattern on the substrate, etc.

(4) In the case of forming a photosensitive dry film and laminating it on a substrate, etc.:

The photosensitive rubber modified acrylic resin composition in a liquid state is applied on a polyethylene terephthalate film for forming a liquid film and, subsequently, it is evaporated and dried to obtain a photosensitive dry film on the polyethylene terephthalate film. The dry film is laminated on the substrate, etc. for preparing a laminated product by means of ordinary lamination method. Then, the photosensitive dry film laminated on the substrate, etc. is cured by irradiating with actinic energy rays in the same method as in the method (1) above.

If it is intended to shape the cured photosensitive film in a desired pattern, the dry film laminated on the support is treated by the similar method to the method (2) or (3) described above.

As the actinic energy rays used for curing the actinic energy ray-curable type resin composition or for patternwise exposure to the resin composition etc., in the course of manufacturing the ink jet recording head according to the present invention, there can be mentioned UV-rays or electron beams which have already been generally put to practical use. As the UV-ray light source, an excimer laser, a high pressure mercury lamp, a super high pressure mercury lamp and a metal halide lamp containing a great amount of light at a wavelength of 250 nm–450 nm, etc. can be used. Those providing a intensity of light near 365 nm at about 1 mW/cm$^2$100 mW/cm$^2$ at a practically allowable lamp-radiated object distance are preferred. Although there is no particular restriction on the electron beam irradiation device, those devices having a dosage within a range from 0.5–20 MRad are practicaly suitable.

The method of manufacturing the ink jet recording head according to the present invention is to be explained referring to the drawings for one embodiment in a case where the ink pathway walls 3H are formed by using a cured film obtained from the dry film type resin composition as described above.

FIG. 2 through FIG. 6 are schematic views for explaining the procedures for manufacturing the ink jet recording head according to the present invention.

Figure 2:
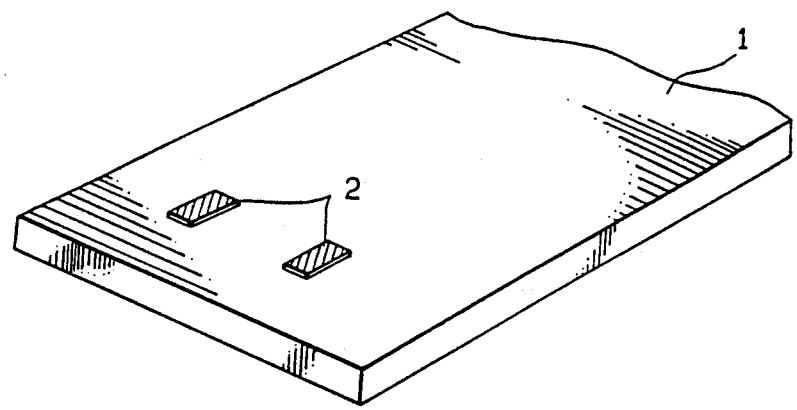

For forming the ink jet recording head according to the present invention, active elements 2 such as a heat generating element or a piezoelement are at first disposed in a desired number on the substrate 1 made of glass, ceramics, plastics or metals as shown in FIG. 2. If required, with an aim of providing the surface of the substrate 1 with resistance to the recording ink, electrical insulating performance, etc., a protection layer made of $SiO_2$,$Ta_2O_5$, glass, etc. may be coated on the surface. Further, electrodes for inputting recording signals, although not illustrated, are connected to the active elements 2.

Figure 3A:
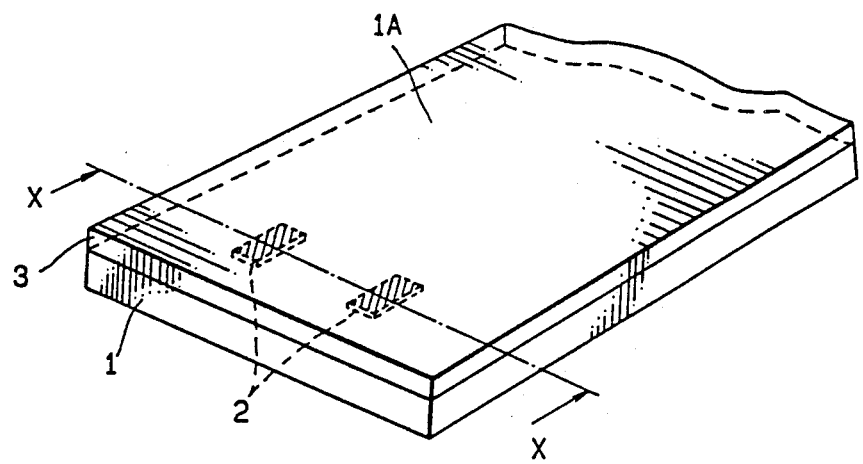
Figure 3B:
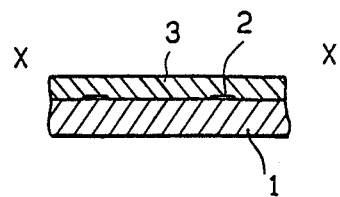

Then, after the surface of the substrate 1 obtained by way of the steps shown in FIG. 2 has been cleaned and dried, for example, at a temperature of 80° to 150° C., the dry film type actinic energy ray-curable resin composition 3 (about 20 um–200 um film thickness) is warmed to a temperature of about 40°–130° C. and then laminated on the substrate surface 1A, for example, at a rate of 0.5–0.4 f/min under the pressure condition of from 1 to 3 kg/cm$^2$ as shown in FIGS. 3(a) and (b).

Figure 4:
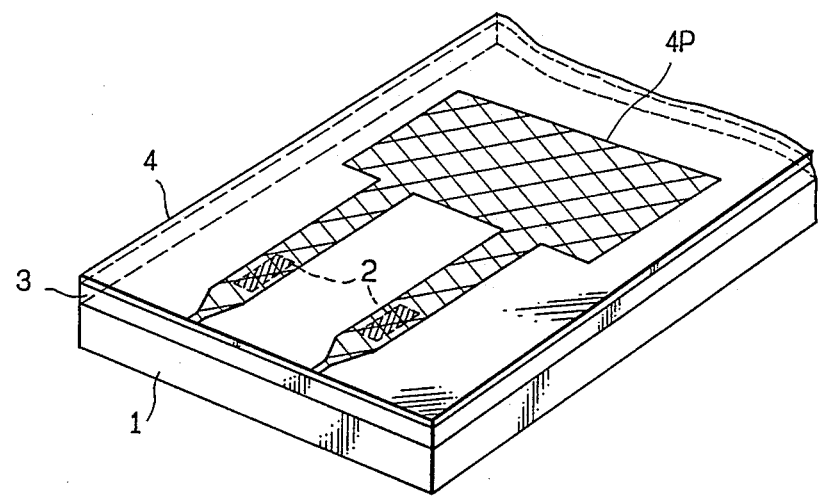

Successively, after overlaying a photomask 4 having a pattern 4P of a predetermined shape not allowing the actinic energy rays to permeate therethrough over the dry film layer 3 disposed on the substrate surface 1A as shown in FIG. 4, exposure is conducted from above the photomask 4.

The photomask 4 and the substrate 1 are aligned such that the elements 2 are positioned in the ink pathway region formed finally by way of the steps of exposure, development, etc., which can be practiced, for example, by previously drawing alignment marks to the substrate 1 and the mask 4 respectively and then conducting alignment in accordance with the marks.

When exposure is thus conducted, other areas than that coated with the pattern, that is, the exposed portion of the dry film layer 3 are cured by polymerization to become solvent insoluble, while the not-exposed portions are left as solvent soluble.

For the actinic energy rays used in the patternwise exposure, suitable known sources of antinic energy rays can properly be selected and used depending on the types of ingredients for the actinic energy ray-curable composition, etc. and they can include specifically a, high pressure mercury lamp, a super high pressure mercury lamp, a metal halide lamp, a carbon arc lamp, electron beams. etc.

For instance, as the UV-ray light source, a high pressure mercury lamp, a super high pressure mercury lamp, a metal halide lamp, etc. containing a great amount of light at a wavelength of 250 nm to 450 nm can be used and those providing an intensity of light near 365 nm of 1 mW/cm$^2$ to 100 mW/cm$^2$ at a practically allowable lamp-irradiated object distance are preferred. Although there is no particular restriction to the electron beam irradiation devices, those devices having a dosage within a range from 0.5 to 20 MRad are practically suitable.

Figure 5A:
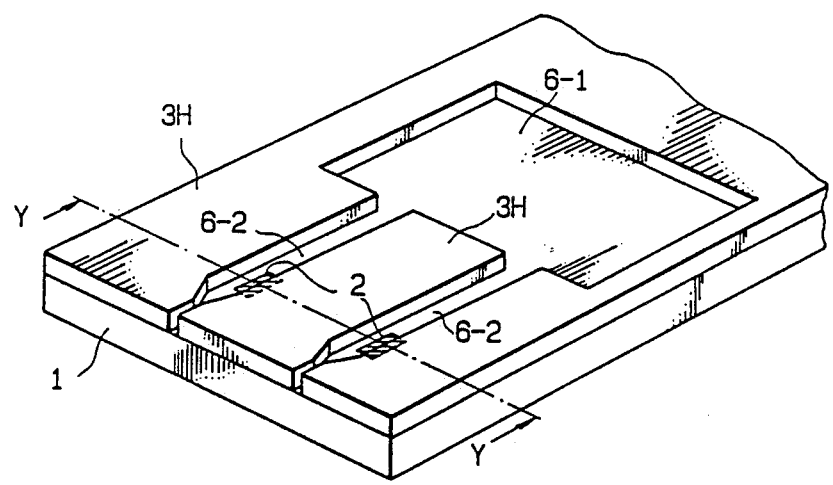
Figure 5B:
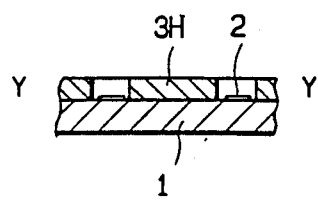

After the completion of the patternwise exposure to the dry film 3, the exposed dry film is then applied to developer, for example, by dipping it in a volatile organic solvent such as 1,1,1-trichloroethane, by which the not-polymerized (not-cured) portion of the dry film layer 3 which is solvent soluble is dissolved and removed from the substrate 1, and grooves finally constituting the ink pathways 6-2 and ink chamber 6-1 are formed with the resin cured film 3H remaining on the substrate 1 as shown in FIGS. 5(a) and (b).

Then, the cured resin film 3H on the substrate 1 is heat-polymerized by heating at a temperature at least higher than 80° C. for about 10 min–3 hours.

In the recording head of this embodiment, although an explanation has been provided of an example in which the dry film type resin composition, that is, a solid is used for forming the grooves that constitute the ink pathways 6-2 and the ink chamber 6-1, the photosensitive rubber-modified acrylic resin composition that can be used upon forming the recording head according to the present invention is not restricted only to matter in the solid state; a liquid composition may of course also be used.

As a method of forming the layer comprising the resin composition by using the liquid composition on the substrate, there can be mentioned, for example, a squeeze method used for preparing a relief image, that is, a method of forming walls of a height corresponding to the desired coating film thickness of the resin composition at the periphery of the substrate and eliminating excess resin composition by means of applying a squeeze thereto. In this case, the appropriate viscosity of the resin composition is from 100 cp to 3000 cp. Further, the height of the walls disposed at the periphery of the substrate has to be determined while taking the evaporation loss of the solvent contained in the photosensitive resin composition into consideration.

In the case of using a solid resin composition, a method of appending the dry film by press-bonding under heating on the substrate as described above is preferred.

However, upon forming the recording head in accordance with the present invention, the use of a solid film type is convenient for its ease of handling, and because its thickness can be controlled easily and accurately.

Figure 6A:
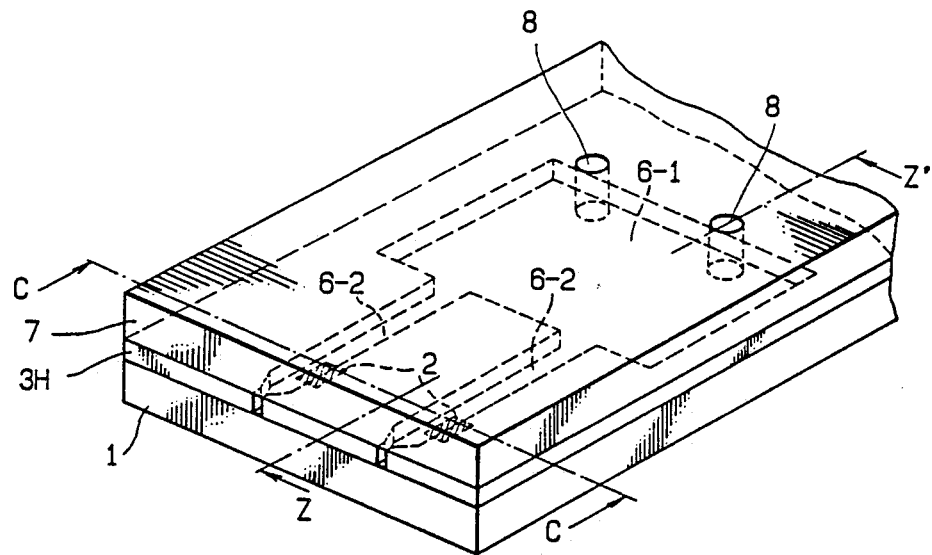
FIGS. 6(a) and 6(b), are schematic views explaining the structure of an ink jet recording head according to the present invention, as well as a method of manufacturing the same.

In this way, after forming the grooves finally constituting the ink pathways 6-2 and the ink channel 6-1 by means of the resin cured film 3H, a flat plate as a cover for the grooves is bonded on the resin cured film 3H by means of adhesives to form a bonded structure as shown in FIGS. 6(a) and (b).

In the step shown in FIGS. 6(a) and (b), as a specific method of disposing the lid 7, there is a method, for example, of applying epoxy resin adhesives to a thickness of 3 to 4 um by means of spin coating on the flat plate 7 made of glass, ceramics, metals, plastics, etc., subsequentyly, preheating them to render the adhesive layer into a so-called B stage form, which is then appended on the cured dry film 3H, and then applying main curing to the adhesive layer. On the other hand, a method of not using the adhesives may also be used, such as of heat fusing the flat plate 7 made of thermoplastic resin such as acrylic resin, ABS resin and polyethylene onto the resin cured film 3H directly.

In addition, a method of disposing a resin layer comprising a resin composition for forming the resin cured plate in the present invention to the lid 7 on the side bonded with the ink pathway, heat fusing the resin layer with the resin cured film 3H formed with the ink pathway and, thereafter, heating them by irradiating actinic energy ray, that is, a method of using the resin composition for forming the resin cured film in the present invention as the adhesive is also preferred.

Figure 6B:
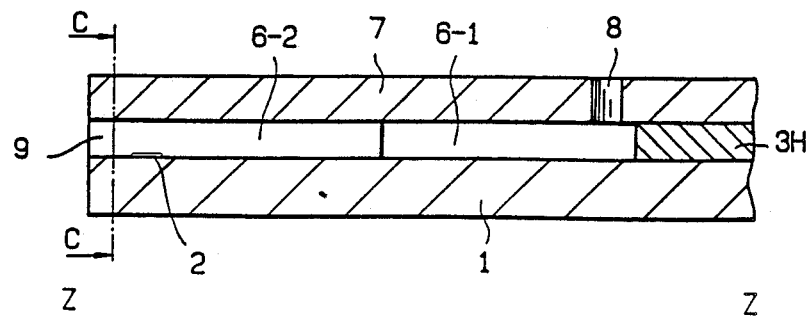

In FIG. 6, are shown the ink chamber 6-1, ink pathways 6-2 and through holes 8 for connecting the ink chamber 6-1 with supply tubes (not illustrated) for supplying the recording ink from the outside of the recording head (not illustrated) to the inside.

In this way, after completing the bonding between the resin cured film 3H disposed on the substrate 1 and the flat plate 7, the bonded structure is cut out along line C—C at the downstream of the ink pathways 6-2 shown in FIGS. 6(a) and (b), to form orifices for jetting out the recording ink as openings for the ink pathways at the cut face.

This step is applied for making the distance between the active elements 2 and the orifice 9 appropriate and the region to be cut is properly selected Upon cutting, a dicing method, etc. usually employed in the semiconductor industry can be used.

The downstream portion to the ink pathway referred to in the present invention means the downstream region along the flowing direction of the recording ink when recording is being conducted by using the recording head specifically, the portion of the ink pathway downstream from the position in which the active element 2 is disposed.

When the cutting has been completed, the cut face is polished to be smooth and the supply tubes 10 are attached to the through holes 8 to complete the ink jet recording head as shown in FIG. 1.

In the embodiment as explained above, although the resin cured film 3H is formed over the substrate 1 and, subsequently, the lid is bonded therewith, the resin cured film 3H may be formed on the side of the lid 7, which may then be bonded to the substrate 1. Furthermore, the ink pathways 6-2 and the ink chamber 6-1 may be formed separately.

PREFERRED EMBODIMENT OF THE INVENTION

The advantages of this invention are now described in more detail by reference to the following examples, which are provided merely for illustrating purposes only, and are not intended to limit the scope of this invention.

At first, synthesis examples are shown below for the constituent ingredient of the photosensitive rubber-modified acrylic resin composition, that is the high weight molecular compound (A) used for preparing the ink jet recording head according to the present invention.

SYNTHESIS EXAMPLE 1

A mixture composed of 90 g of methylmethacrylate 10 g of glycidylmethacrylate, and 100 g of DMF was sufficiently bubbled with $N_2$ to thereby remove $O_2$, to which 0.2 g of azobisisobutyronitrile was added while maintaining the mixture at 70° C. to carry out thermal polymerization for 5 hours. To the resultant, there were added 60 g of liquid 1,2-polybutadiene (Mw=1000) having a carboxyl group at one terminal end and 0.1 g of 2,4,6-tri(dimethylaminomethyl) phenol, and the resultant reaction mixture was subjected to a condensation reaction at 70° C. for 5 hours to thereby obtain a polybutadiene-grafted acrylic polymer of the structural formula (I) shown in Table 2 which has a number average molecular weight of 15,000.

SYNTHESIS EXAMPLE 2

1000 g of heptane, 0.31 g of titanium trichloride, 0.46 g of triethyl aluminum and 2.95 g of diethylzinc were entered into an autoclave charged with argon gas, the reaction system was maintained at 0.6 atm. for butylene pressure to carry out a polymerization reaction at 40° C. for 2 hours, to obtain polybutylene. The resultant polybutylene was filtrated under nitrogen gas atmosphere, which was followed by dispersing into 1000 ml of heptane. To the resultant dispersion, 3.65 g of cumene hydroperoxide and 70 g of methylmethacrylate were added to obtain a mixture, which was followed by stirring at 40° C. for 3 hours. The resultant was filtrated under nitrogen gas atmosphere and was treated with methanol-hydrochloric acid at room temperature for 12 hours. The resultant was extracted with acetone and methanol to thereby obtain polybutylene of the structural formula (II) shown in Table 2 which has a number average molecular weight of 20,000.

SYNTHESIS EXAMPLE 3

A mixture composed of methylmethacrylate and glycidylmethacrylate (97:3 by molar ratio) was dissolved in toluene, which was followed by solution polymerization at 80° C. for 3 hours using azobisisobutylonitrile as the polymerization initiator to thereby obtain acrylic oligomer having a number average molecular weight of 7,000. This oligomer was suspended in a solution of Hycar CTBN (trade name of Ube Kohsan K.K., molecular weight: 3,400), which is a COOH-terminated NBR rubber in liquid state, which was dissolved in a solvent composed of xylene and 1,1,1-trichloroethane (50:50) to thereby obtain a suspension, which was followed by reaction in the presence of a catalyst comprising tetrabutylammonium hydrochloride at 90° C. for 5 hours.

An excessive amount of methyl ethyl ketone was added to the reaction product to precipitate an unreacted liquid rubber product, which was separated from the remaining solution to thereby obtain CTBN-grafted acrylic polymer of the structural formula (III) shown in Table 2 which has a number average molecular weight of 15,000.

SYNTHESIS EXAMPLE 4

Polymethylmethacrylate and carbamoylethylmethacrylate were subjected with the molar ratio of 90:10 to solution polymerization in dehydrated and dried toluene at 70° C. for 5 hours to obtain acrylic polymer having a number average molecular weight of 13,000. This solution containing the acrylic polymer was maintained at 70° C., and a toluene solution containing a OH-terminated butadiene rubber in liquid state (Polybd R-45M of Idemitsu Petroleum Chemical Co., Ltd., molecular weight: 2,000) was added to the aforesaid solution being maintained at 70° C., which was followed by reaction for 6 hours. After the reaction was completed, an excessive amount of methyl ethyl ketone was added to the resultant solution to remove precipitated unreacted liquid rubber, thereby obtaining a graft copolymer of the structural formula (IV) shown in Table 2 which has a number average molecular weight of 27,000.

SYNTHESIS EXAMPLE 5

Methylmethacrylate, isobonylmethacrylate and 2-hydroxyethylmetaacrylate were subjected with the molar ratio of 70:20:10 to solution polymerization in xylene in which azobisisobutylonitrile as the catalyst and t-dodecyl mercaptan as the chain transfer agent were present, to thereby obtain acrylic polymer having a number average molecular weight of 14,000. A xylene solution containing Nisso PB 1000 resin (product of Nihon Soda K.K.) was added to the foregoing xylene solution containing the resultant acrylic polymer while stirring at 80° C., and the reaction mixture was refluxed for 8 hours to thereby obtain a polymer of the structural formula (V) shown in Table 1 which has a number average molecular weight of 17,000.

SYNTHESIS EXAMPLE 6

Styrene and maleic anhydride were subjected with the molar ratio of 90:10 to copolymerization by way of the a conventional method, to thereby obtain a polymer having a number average molecular weight of 5,000.

Epoxy polybutadiene BF-1000 (product of Adeka Argus K.K.) was added to a solution of this polymer in a solvent comprising methyl isobutyl ketone/toluene (50:50 by the weight ratio) while stirring at 70° C. and the reaction mixture was engaged in reaction for 3 hours, to thereby obtain a graft copolymer comprising a styrenic chain grafted with a polubytadiene chain having the structural formula (IV) shown in Table 2 which has a number average molecular weight of 7,000.

SYNTHESIS EXAMPLE 7

Using a macromonomer having a polyisobutadiene rubber chain which is represented by the structural formula (VIII) shown in Table 2, it was subjected to anion copolymerization with methylmethacrylate in the presence of secbutyl Li as the catalyst in tetrahydrofuran at −78° C. to thereby obtain a graft copolymer of the structural formula (VII) shown in Table 2 which has a number average molecular weight of 9,600.

Photopolymerizable material and photopolymerizable resin initiator were mixed at the blending ratio shown in Table 3 to the respective polymeric material obtained in Synthesis Examples 1 to 7 to obtain 8 kinds of photopolymerizable resin composition according to the present invention shown in Table 3 (Composition Examples 1 to 8). Table 3 shows Comparative Examples for the case of using as the polymeric material, Dianal RB80 (manufactured by Mitsubishi Rayon K.K.)(Comparative Example 1) and using a copolymer obtained by polymerizing methlmethacrylate, acrylic acid and 2-hydroxyethylmethacrylate in 85:5:10 molar ratio (number average molecular weight: 50,000) (Comparative Example 2). Specimens for each of the photopolymerizable resin compositions of the Composition Examples 1 to 8 and each of the photopolymerizable resin compositions of Comparative Examples 1 and 2 were dissolved in solvent shown in Table 3, and each of the resultant solutions was coated on a TEDLAR FILM (trade name of products from Du Pont Co., Ltd.)(coating thickness of 50 μm after drying). After removing the solvent by drying, light from high pressure mercury lamps was irradiated by 5J/cm² in total to conduct complete curing.

The coated film was isolated and the Tg and the modulus of elasticity were measured by using a compulsory vibration dynamic viscoelasticity measuring device "Rheolograph Solid"(manufactured by Toyo Seiki K.K.). The results of the measurement were as shown in Table 4.

From the results shown in Table 4, the following facts were found. That is, the photopolymerizable resin composition according to the present invention had Tg from 105° C. to 30° C. and the modulus of elasticity at 25° C. in the order of $10^8$ or $10^9$ with the linear expansion coefficient being varied greatly, which turning point being more or less around the same as that of the conventional photopolymerizable resin compositions. Accordingly, it does not show a remarkable difference from the conventional photopolymerizable resin compositions with respect to the distortion relative to mechanical or thermal external forces. However, the modulus of elasticity is lower by one digit as compared with that of the conventional photopolymerizable resin compositions and, as a result, there is no problem of cracking or peeling, which occurred mechanically or thermally, as experienced in the case of the cured products of conventional photopolymerizable resin compositions.

EXAMPLE

A portion for each of the liquid photopolymerizable resin compositions obtained as described above was coated on a polyethylene terephthalate film (Lumilar-T type) of 25 μm thickness using a reverse coater, and the resultant coating film was dried to obtain a dry coating film layer (dry film) of 80 μm thickness.

Further, a stretched polyethylene film of 40 μm thickness was laminated as a cover film over the dried coating film layer to obtain a laminate in which an actinic energy ray-curable type resin composition layer (80 μm thickness) as the dry film is sandwiched between two films.

EXAMPLES 1 TO 8

Using dry films obtained as described above from each of the liquid photosensitive resin compositions prepared in the above-mentioned Blending Examples 1 through 8 and in accordance with the step shown FIGS. 1 through 6 explained before, an ON-demand type ink jet recording head as shown in FIG. 7(d) having 10 heat generating elements as the active element (heat generating resistance layer: hafnium boride ($HfB_2$)) and orifices corresponding to the heat generating elements (orifice size: 80 μm×120 μm, pitch 0.200 mm) were manufactured as described below. Each of 30 recording heads of an identical shape was manufactured in this test.

At first, a plurality of heat generating elements were arranged at a predetermined positions on silicon substrates, to which electrodes for applying recording signals were connected.

Then, an $SiO_2$ layer (1.0 μm thickness) was disposed as the protection film on the surface of the substrate on which the heat generating elements were disposed and, after cleaning and drying the surface of the protection layer, the dry film of 80 μm thickness obtained in Synthesis Example 1 and warmed to 100° C. was laminated over the protection film while peeling the polyethylene film by using a rubber roll under the condition of a roll temperature at 100° C. and a circumferential speed of 1.0 m/min (condition).

Successively, a photomask having a pattern corresponding to the shape of the ink pathways and the ink chamber was laid over the dry film disposed on the surface of the substrate and vacuum was applied thereto while performing alignment that the elements are disposed at the finally formed ink pathways. Subsequently, the dry film was exposed for 20 sec. by the irradiation from above the photomask using a super high pressure mercury lamp with a UV-ray intensity near 365 nm of 10 mW/cm² and at high parallelism with a collimation deflection angle of 3°.

Then, after the exposure was over and the polyethylene terephthalate film was peeled from the dry film on the substrate, the dry film was applied with spray development by using 1,1,1-trichloroethane (trade name: Ethanar Nu) at 20° C. for 50 sec, to dissolve and remove the unreacted (not-cured) portion of the dry film from the substrate, and grooves finally constituting the ink pathway and the ink chamber were formed by the cured dry film remaining on the substrate.

After the development was over, the cured dry film on the substrate had applied thereto post-irradiation (UV-post curing) by using a super high pressure mercury lamp under the same conditions as those used for the pattern exposure and, further, the substrate had applied thereto post-curing by conducting heat treatment at 150° C. for 15 min.

In this way, grooves constituting the ink pathways and the ink chamber were formed on the substrate by means of walls comprising the cured dry film.

On the other hand, the dry film obtained in Synthesis Example 1 was laminated on a flat plate made of soda glass (top plate), to which the ink chamber was formed and the through holes were disposed by using a rubber roller under the conditions of a roll temperature of 120° C. and a roll speed of 1 m/min, while peeling the polyethylene film. Then, exposure and development were applied under the same conditions as those in the step of forming the ink pathways and the ink chamber as described above except for using a mechamask of 10 μm film thickness, to remove the dry film from the flat plate at the portion corresponding to the portion above the ink chamber.

Then, the surface of the cured dry film on the flat plate and the surface of the cured film on the substrate prepared previously are bonded under pressure and adhered securely by the UV-ray irradiation (50 mW/cm$^2$, 60 sec) on the side of the flat plate, to form a bonded structure.

Successively, a portion of the bonded structure downstream of the ink pathways, that is, at a position of 0.150 mm downstream from the position in which the active elements are disposed was cut perpendicular to the ink pathways by using a commercially available dicing saw (trade name: Model, DAD 2H/6 manufactured by DISCO Co.), to form orifices for discharging the recording ink.

Finally, the cut face was cleaned and dried and further polished smoothly, while supply tubes for the recording ink were attached to the throughholes to complete an ink jet recording head. Each of the thus obtained recording heads had highly accurate dimensions and had the ink pathways and the ink chamber reproduced at high fidelity to the mask pattern. By the way, the orifice size is 80±5 μm in length and 80±5 μm in width and the orifice pitch was in the range of 200±5 μm.

COMPARATIVE EXAMPLES 1 2

Two kinds of photopolymerizable resin compositions obtained by mixing the constituent ingredients shown in Table 3 at a ratio shown therein (Comparative Example 1, 2) were dissolved in solvents shown in Table 3, the solutions were processed with the same procedures as described above to thereby obtain dry films, and two types of ink jet recording heads were manufactured by using them in the same procedures as those in Examples 1 through 8.

EVALUATION

For the respective ink jet recording heads manufactured in Examples 1 through 8 and Comparative Examples 1 and 2 described above, the quality and the long-time durability were as evaluated described below.

At first, each of the ink jet recording heads was put to heat cycle tests (−65° C. (30 min)←125° C. (30 min)) and the development of cracks was observed at the end of the test cycle, each after 100 cycles, 200 cycles and 300 cycles and the result of the observation is shown in Table 5.

Then, each of the ink jet recording heads was immersed in an ink comprising 50% of water, 48% of DEG and 2% of dye in volume ratio and maintained at a temperature of 80° C. Then, the occurrence of defoliation was observed after one, two and three months of the immersion time and the results of the observation are shown in Table 6.

As a result, the followings have been found. That is, referring to the occurrence of cracking as apparent from the results .n: Table 5, the ink jet recording heads according to the present invention (Examples 1 through 8) were satisfactory with no development of cracks even after the application of heat cycle tests of 300 cycles, whereas each of the ink jet recording heads of Comparative Examples (Comparative Examples 1, 2) developed cracks at the heat cycles test of 200 cycles.

As is apparent from the results shown in Table 6, referring to the occurrence of defoliation, each of the ink jet recording heads according to the present invention (Examples 1 through 8) was satisfactory, showing no occurrence of defoliation even being immersed over a long time of 3 months, whereas each of the ink jet recording heads in Comparative Examples 1,2 caused defoliation.

TABLE 1

| material | coefficient of linear expansion ($10^{-5}$/°C.) |
|---|---|
| glass plate (TEMPAX: product of Shot Co. Ltd.) | 0.32 |
| Si-single crystal | 0.76 |
| ceramic (alumina) | 0.81 |
| photosensitive acrylic resin composition | 9.0 |

TABLE 2

Structural formula (I)

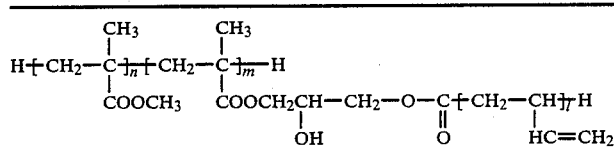

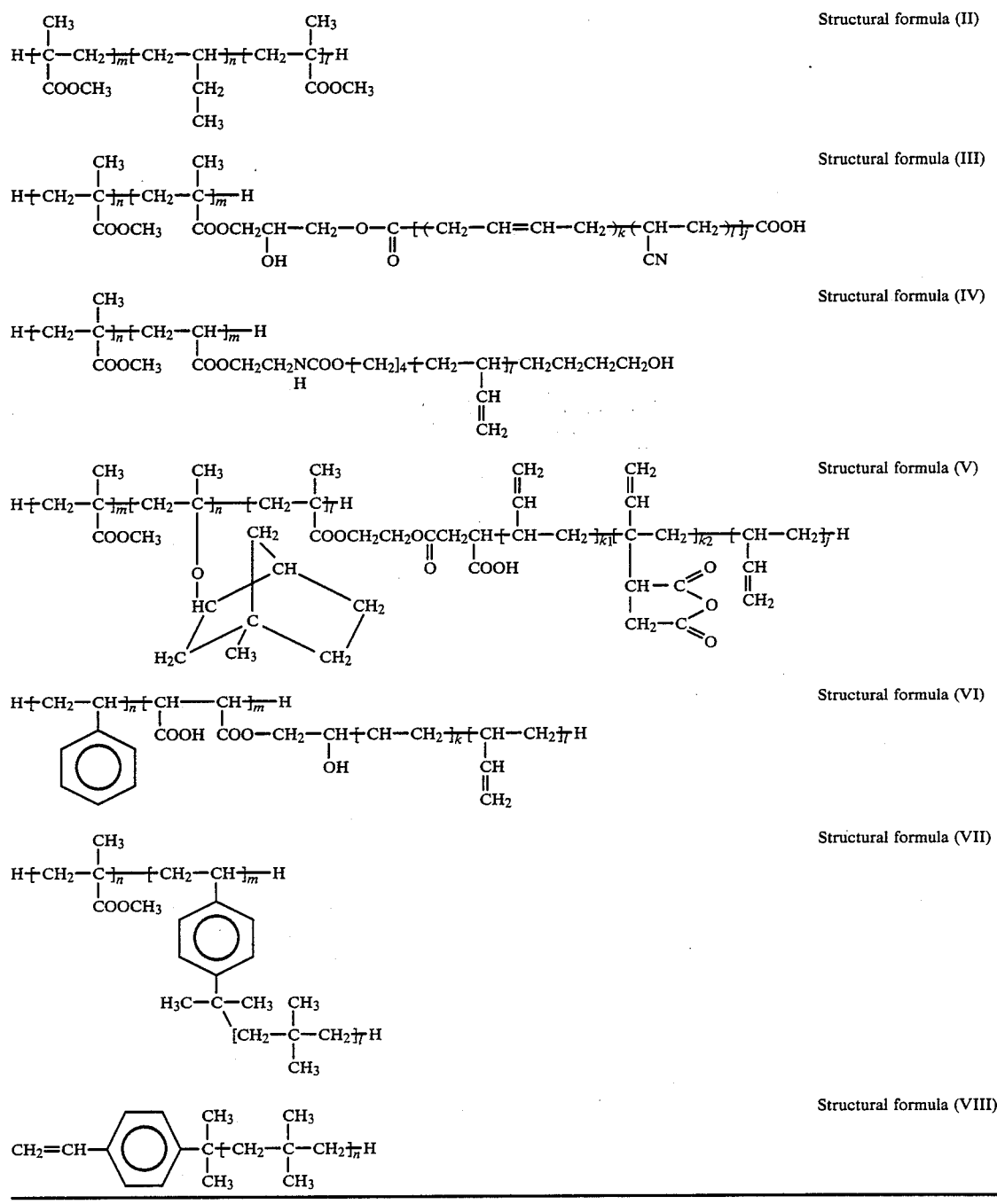

TABLE 3

| Composition Example | high molecular compound | photopolymerizable compound | | photopolymerization initiaor | | solvent |
|---|---|---|---|---|---|---|
| 1 | Synthesis Example 1: 50 parts | acrylic ester of Epicoat 828*3 trimethylolpropanetriacrylate | 40 parts 40 parts | Irugacure 184*1 | 3 parts | DMF |
| 2 | Synthesis Example 2: 60 parts | acrylic ester of Epicoat 828*3 trimethylolpropanetriacrylate | 40 parts 40 parts | Irugacure 184 | 3 parts | heptane |
| 3 | Synthesis Example 3: 40 parts | Aronix M-1100*4 Aronix M-215*5 | 40 parts 20 parts | Irugacure 651*2 | 5 parts | toluene |
| 4 | Synthesis Example 4: 40 parts | photomer 6008*6 Aronix M-215 | 50 parts 20 parts | Irugacure 651 | 5 parts | toluene |
| 5 | Synthesis Example 5: 50 parts | triarylisocyanulate triethyleneglycoldiacrylate | 40 parts 30 parts | benzophenone 4-dimethylaminoaceto- | 4 parts 2 parts | xylene |

TABLE 3-continued

Composition Examples 1 to 8: photopolymerizable resin compositions of the present invention

| | | | | | | | | |
|---|---|---|---|---|---|---|---|---|
| 6 | Synthesis Example 6: 50 parts | triarylisocyanulate dipropyleneglycoldimethylmethacrylate | 40 parts 30 parts | phenone benzophenone 4-dimethylaminoacetophenone | 4 parts 2 parts | TIM/toluene (weight ratio: 50:50) | | |
| 7 | Synthesis Example 7: 40 parts | acrylic acid ester of hydrogenated bisphenol A diglycidyl ether | 60 parts | Irugacure 651 | 4 parts | THF | | |
| 8 | Synthesis Example 6: 40 parts | acrylic acid ester of hydrogenated bisphenol A diglycidyl ether melaminetriacrylate | 30 parts 30 parts | Irugacure 651 | 4 parts | TIM/toluene (weight ratio: 50:50) | | |

| Comparative Composition Example | high molecular weight compound | photopolymerizable compound | | photopolymerization initiaor | | solvent |
|---|---|---|---|---|---|---|
| 1 | Dianal BR80 (product of Mitsubishi Rayon K. K.) polymethylmethacrylate 50 parts | acrylic ester of Epicoat 828 trimethylolpropanetriacrylate | 40 parts 10 parts | Irugacure 184 | 3 parts | toluene |
| 2 | copolymer obtained by copolymerization of methylmethacrylate, acrylic acid and 2-hydroxymethacrylate (85:5:10 by molar ratio) (number average molecular weight: 50,000) 50 parts | triarylisocyanulate Epoxy ester 3002A*[7] | 40 parts 30 parts | benzophenone 4-dimethylaminoacetophenone | 4 parts 2 parts | |

Note: parts mean parts by weight
*[1] the trade name of Ciba Geigy Co.: hydroxycyclohexylphenylketone
*[2] the trade name of Ciba Geigy Co.: 2,2-dimethoxy-2-phenylacetophenone
*[3] the trade name of Yuka Shellepoxy K. K.: bisphenol A epoxyresin
*[4] the trade name of Toa Gohsei K. K.: polyester series urethanacrylate
*[5] the trade name of Toa Gohsei K. K.: diacrylate having an isocyanulate nucleus
*[6] the trade name of Sannobuko K. K.: aromatic urethanacrylate (structure unknown)
*[7] the trade name of Kyoeisha Yushikagaku kohgyo K. K.: diacrylate of bisphenol A derivative

TABLE 4

The Tg and the modulas of elasticity for a cured film

| | Tg measured by dynamic viscoelasticity | modulas of elasticity at 25°C. (dyn/cm$^2$) |
|---|---|---|
| Composition Example 1 | 113° C. | $1.5 \times 10^9$ |
| Composition Example 2 | 110° C. | $1.8 \times 10^9$ |
| Composition Example 3 | 120° C. | $9.5 \times 10^8$ |
| Composition Example 4 | 105° C. | $9.0 \times 10^8$ |
| Composition Example 5 | 130° C. | $2.0 \times 10^9$ |
| Composition Example 6 | 110° C. | $8.5 \times 10^8$ |
| Composition Example 7 | 108° C. | $8.5 \times 10^8$ |
| Composition Example 8 | 116° C. | $1.0 \times 10^9$ |
| Comparative Composition Example 1 | 125° C. | $3.5 \times 10^{10}$ |
| Comparative Composition Example 2 | 120° C. | $5.0 \times 10^{10}$ |

TABLE 5

| | | Heat Cycle Test | | |
|---|---|---|---|---|
| | | 100 Cycle | 200 Cycle | 300 Cycle |
| Example 1 | photopolymerizable composition 1 | O | O | O |
| Example 2 | photopolymerizable composition 2 | O | O | O |
| Example 3 | photopolymerizable composition 3 | O | O | O |
| Example 4 | photopolymerizable composition 4 | O | O | O |
| Example 5 | photopolymerizable composition 5 | O | O | O |
| Example 6 | photopolymerizable composition 6 | O | O | O |
| Example 7 | photopolymerizable composition 7 | O | O | O |
| Example 8 | photopolymerizable composition 8 | O | O | O |
| Comparative Example 1 | comparative composition 1 | O | X | X |
| Comparative Example 2 | comparative composition 2 | O | X | X |

Note:
heat cycle condition: −65 °C. (30 min.) ⇌ 125° C. (30 min.)
X: cracks generated
O: no crack generated

TABLE 6

| | | Dipping Test in Ink | | |
|---|---|---|---|---|
| | | 1 month | 2 months | 3 months |
| Example 1 | photopolymerizable composition 1 | O | O | O |
| Example 2 | photopolymerizable composition 2 | O | O | O |
| Example 3 | photopolymerizable composition 3 | O | O | O |
| Example 4 | photopolymerizable composition 4 | O | O | O |
| Example 5 | photopolymerizable composition 5 | O | O | O |
| Example 6 | photopolymerizable composition 6 | O | O | O |
| Example 7 | photopolymerizable composition 7 | O | O | O |
| Example 8 | photopolymerizable composition 8 | O | O | O |
| Comparative Example 1 | comparative composition 1 | O | O | X |
| Comparative | comparative | O | O | X |

TABLE 6-continued

| | Dipping Test in Ink | | |
|---|---|---|---|
| | 1 month | 2 months | 3 months |
| Example 2 composition 2 | | | |

Note:
ink dipping condition: temperature of the ink: 80° C.
composition of the ink used: water: 50%
DEG: 48%
dye stuff: 2%
X: peelings occurred
O: no peeling occurred

What is claimed is:

1. An ink jet recording head having an ink pathway in communication with a jetting exit formed on a substrate on which an active element for generating energy utilized for jetting an ink is disposed, at least a portion of said ink pathway being constituted by a cured film of a photosensitive resin composition, wherein said photosensitive resin composition comprises a photopolymerizable resin composition comprising:

(a) a high molecular weight compound comprising a styrenic or acrylic monomer chain portion, and a monomer chain portion the homopolymer of which is rubber, and having a number average molecular weight of 5,000 to 30,000;

(b) a photopolymerizable compound having two or more acryloyl groups or methacryloyl groups in one molecule; and (c) a photopolymerization initiator.

2. The ink jet recording head according to claim 1, wherein said active element is a heat generating element.

3. The ink jet recording head according to claim 1, wherein said active element is a piezoelectric element.

4. The ink jet recording head according to claim 1, wherein the jetting exit is formed with said cured film.

* * * * *

UNITED STATES PATENT AND TRADEMARK OFFICE
CERTIFICATE OF CORRECTION

PATENT NO. : 4,970,532
DATED : November 13, 1990
INVENTOR(S) : HIROKAZU KOMURO ET AL.

It is certified that error appears in the above-identified patent and that said Letters Patent is hereby corrected as shown below:

COLUMN 2

Line 3, "its" should read --the--.
　　　Line 13, "fices," should read --fices-- and
　　　　　　　"interrupted" should read --interrupted and--.

COLUMN 3

Line 20, "reading head" should read --recording head--.

COLUMN 4

Line 1, "know" should read --known--.
　　　Line 5, "FIGS. (a)" should read --FIGS. 3(a)--
　　　Line 6, "FIGS. (a)" should read --FIGS. 5(a)--.
　　　Line 59, "large" should read --large,--.
　　　Line 67, "$\sigma = kx\epsilon$　　　　　　　　(1)" should read
　　　　　　　--$\sigma = kx\epsilon xE$　　　　　　(1)--.

COLUMN 5

Line 9, "taken a notice on" should read --noticed--.
　　　Line 11, "earnest" should read --an earnest--.
　　　Line 65, "of" should be deleted.

COLUMN 6

Line 52, "high" should read --a high--.
　　　Line 55, "zation" should read --zable--.
　　　Line 61, "2-hydroxyethyl methacrylte," should read
　　　　　　　--2-hydroxyethyl methacrylate,--.

UNITED STATES PATENT AND TRADEMARK OFFICE
CERTIFICATE OF CORRECTION

PATENT NO. : 4,970,532

DATED : November 13, 1990

INVENTOR(S) : HIROKAZU KOMURO ET AL.

It is certified that error appears in the above-identified patent and that said Letters Patent is hereby corrected as shown below:

COLUMN 7

Line 14, "molecular compound" should read --molecular weight compound--.
    Line 16, "cyclodomin," should read --cyclodomain,--.
    Line 50, "materials used." should read --materials are used.--.

COLUMN 8

Line 52, "film will" should read --film, to--.
    Line 61, "into" should be deleted.

COLUMN 9

Line 14, "acted on" should be deleted.
    Line 39, "elements" should read --active elements--.
    Line 46, "means a" should read --means of a--.

COLUMN 10

Line 41, "has" should be deleted.
    Line 46, "forgo-" should read --the forego--
    Line 62, "bon" should read --bons--.

COLUMN 11

Line 26, "an" should read --on--.

UNITED STATES PATENT AND TRADEMARK OFFICE
CERTIFICATE OF CORRECTION

PATENT NO. : 4,970,532

DATED : November 13, 1990

INVENTOR(S) : HIROKAZU KOMURO ET AL.

It is certified that error appears in the above-identified patent and that said Letters Patent is hereby corrected as shown below:

COLUMN 12

Line 9, "a" should read --an--.
Line 10, "1 mW/cm$^2$100" should read --1 mW/cm$^2$-100--.
Line 16, "practicaly" should read --practically--.

COLUMN 13

Line 7, "specifically a," should read
--specifically, a--.

COLUMN 14

Line 55, "selected" should read --selected.--.

COLUMN 15

Line 28, "methylmethacrylate" should read
--methylmethacrylate,--.

COLUMN 16

Line 48, "hydroxyethylmetaacrylate" should read
--hydroxyethylmethacrylate--.
Line 66, "the" should be deleted.

COLUMN 17

Line 7, "polubytadiene chain" should read
--polybutadiene chain--.
Line 32, "methlmethacrylate," should read
--methylmethacrylate,--.
Line 47, "the Tg and the" should read --a Tg and a--.

UNITED STATES PATENT AND TRADEMARK OFFICE
CERTIFICATE OF CORRECTION

PATENT NO. : 4,970,532
DATED : November 13, 1990
INVENTOR(S) : HIROKAZU KOMURO ET AL.

It is certified that error appears in the above-identified patent and that said Letters Patent is hereby corrected as shown below:

COLUMN 18

Line 27, "shown" should read --shown in--.
    Line 40, "a" should be deleted.
    Line 57, "vacuum" should read --vacuum bonding--.

COLUMN 19

Line 10, "had applied thereto" should read --was subjected to--.
    Line 13, "the substrate had" should be deleted.
    Line 14, "thereto" should read --with--.

COLUMN 20

Line 2, "COMPARATIVE EXAMPLES 1 2" should read --COMPARATIVE EXAMPLES 1 TO 2--.
    Line 20, "(30 min)←125°C." should read --(30 min)↔125°C.--.
    Line 34, "followings" should read --following--.
    Line 36, ".n:" should read --in--.
    Line 50, "in Comparative Examples 1,2" should read --(in Comparative Examples 1,2)--.

UNITED STATES PATENT AND TRADEMARK OFFICE
CERTIFICATE OF CORRECTION

PATENT NO. : 4,970,532

DATED : November 13, 1990

INVENTOR(S) : HIROKAZU KOMURO ET AL.

It is certified that error appears in the above-identified patent and that said Letters Patent is hereby corrected as shown below:

COLUMN 23

Table 4, "Example 7" close up left margin.

Signed and Sealed this

Fifteenth Day of September, 1992

Attest:

DOUGLAS B. COMER

*Attesting Officer*  *Acting Commissioner of Patents and Trademarks*